(12) United States Patent
Ferguson et al.

(10) Patent No.: US 11,251,601 B2
(45) Date of Patent: Feb. 15, 2022

(54) NON-VOLATILE OVERVOLTAGE DETECTOR

(71) Applicant: BAE Systems Information and Electronic Systems Integration Inc., Nashua, NH (US)

(72) Inventors: Richard J. Ferguson, Bealeton, VA (US); Richard Brosh, Manassas, VA (US); William C. Singleton, Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/848,527

(22) Filed: Apr. 14, 2020

(65) Prior Publication Data

US 2021/0320489 A1 Oct. 14, 2021

(51) Int. Cl.
*H02H 9/04* (2006.01)
*H02H 3/20* (2006.01)
(Continued)

(52) U.S. Cl.
CPC .............. *H02H 3/20* (2013.01); *H01L 27/02* (2013.01); *H02H 7/20* (2013.01); *H02H 9/04* (2013.01);
(Continued)

(58) Field of Classification Search
CPC .. H02H 3/20; H02H 9/00; H02H 7/20; H02H 9/04; H02H 9/025; H02H 9/045;
(Continued)

(56) References Cited

U.S. PATENT DOCUMENTS 5,561,580 A 10/1996 Pounds et al.
6,255,893 B1 * 7/2001 Dishongh .......... G01R 31/3004
327/525

(Continued)

FOREIGN PATENT DOCUMENTS

GB 2098817 A 11/1982

OTHER PUBLICATIONS

EP Search Report, EP 21167179.7, dated Sep. 24, 2021, 7 pages.

*Primary Examiner* — Danny Nguyen
(74) *Attorney, Agent, or Firm* — Finch & Maloney PLLC; Scott J. Asmus (57) ABSTRACT

Techniques are provided for non-volatile detection of an overvoltage condition in a circuit of interest. A circuit implementing the techniques according to an embodiment includes a fuse configured to provide a non-volatile indication of an overvoltage event, the indication associated with an open state of the fuse. The circuit also includes a voltage controlled current switch coupled in series to the fuse. The voltage controlled current switch is configured to enable current flow through the fuse in response to a supply voltage exceeding a threshold value associated with the overvoltage event. The current causes the fuse to switch from a closed state to an open state providing a non-volatile record of the overvoltage event. In some embodiments, the voltage controlled current switch can be a Zener diode with a breakdown voltage based on the threshold value, or a transistor configured to switch into conducting mode at the threshold value.

18 Claims, 9 Drawing Sheets

Overvoltage
Detection Circuit
165a (51) Int. Cl.
*H02H 7/20* (2006.01)
*H01L 27/02* (2006.01)
*H02H 9/08* (2006.01)

(52) U.S. Cl.
CPC ............. *H02H 9/041* (2013.01); *H02H 9/045* (2013.01); *H02H 9/046* (2013.01); *H02H 9/08* (2013.01)

(58) Field of Classification Search
CPC .......... H02H 9/08; H02H 9/046; H01L 27/02; H01L 23/525; H01L 29/866; H01L 23/5256; H01L 27/0255; H01L 27/0288
USPC .......................................... 361/56, 91.1, 111
See application file for complete search history.

(56) References Cited

U.S. PATENT DOCUMENTS

| | | | |
|---|---|---|---|
| 6,411,482 B1 * | 6/2002 | Funke | H02H 3/048 361/58 |
| 9,401,593 B2 | 7/2016 | Gascuel | |
| 2003/0076638 A1 * | 4/2003 | Simonelli | G05F 1/573 361/56 |
| 2007/0152732 A1 * | 7/2007 | Solano | G11C 29/56 327/525 |
| 2012/0169402 A1 * | 7/2012 | Kawasaki | H01L 27/0288 327/525 |
| 2017/0338648 A1 * | 11/2017 | Carletti | H02H 3/20 |
| 2019/0128939 A1 | 5/2019 | O'Donnell | |

* cited by examiner

NON-VOLATILE OVERVOLTAGE DETECTOR

FIELD OF DISCLOSURE

The present disclosure relates to overvoltage detection, and more particularly, to non-volatile detection of an overvoltage condition in a circuit or system of interest.

BACKGROUND

Rapid assessment and resolution of overvoltage events occurring in circuits of interest, can be important, whether those events are real or perceived. In response to the detection of an overvoltage event, hardware is typically shut down and the event is recorded for subsequent investigation. Unfortunately, these events are often one-time events and it can be difficult to determine whether the hardware or the test equipment is at fault.

BRIEF DESCRIPTION OF THE DRAWINGS

FIG. 5 illustrates another overvoltage detection circuit, configured in accordance with certain other embodiments of the present disclosure.

Although the following Detailed Description will proceed with reference being made to illustrative embodiments, many alternatives, modifications, and variations thereof will be apparent to those skilled in the art.

DETAILED DESCRIPTION

Techniques are provided for non-volatile detection of an overvoltage condition in a circuit of interest. The detection is said to be non-volatile, because a persistent record of its occurrence is created, even after the system that generated the overvoltage condition is powered down. Thus, if the overvoltage condition is fleeting or otherwise no longer present, the non-volatile record created remains and provides a useful tool to help identify and address the overvoltage condition. A circuit implementing the techniques according to one example embodiment includes a fuse configured to provide a non-volatile indication of an overvoltage event, the indication associated with an open state of the fuse. The circuit also includes a voltage controlled current switch coupled in series to the fuse. The voltage controlled current switch is configured to enable current flow through the fuse in response to a supply voltage exceeding a threshold value associated with the overvoltage event. The current causes the fuse to switch from a closed state to an open state, thereby providing a non-volatile record of the overvoltage event. In some embodiments, the voltage controlled current switch can be a Zener diode with a breakdown voltage based on the threshold value, or a transistor configured to switch into conducting mode at the threshold value. In any such cases, the status of the fuse state can be sensed and communicated to local or remote resources for further action, as needed. Numerous configurations and applications will be appreciated.

General Overview

As noted previously, assessment and resolution of an overvoltage event in a circuit can be critical in certain applications, particularly mission critical applications or costly applications where retrieval and repair of damaged circuitry is difficult or otherwise not practical, such as space-based applications (e.g., satellites and other orbital equipment). In response to the detection of an overvoltage event, hardware is typically shut down and the event is recorded for subsequent investigation, whether the event is real or perceived. Because these events are often one-time events, however, it can be difficult to determine whether the hardware is actually at fault, or the test equipment is at fault. Thus, an alternative technique is needed which can distinguish between these possibilities.

To this end, overvoltage detection circuits are herein disclosed which provide the capability for non-volatile recording of an overvoltage event. That is to say, detection of an overvoltage event is preserved in a non-volatile or persistent manner that allows for either contemporaneous or subsequent analysis to determine that the overvoltage event is authentic, even if temporary or non-persistent, and not a fault or artifact of the test equipment measurement. The event can be any number of faults generally referred to herein as an overvoltage condition, including but not limited to a high or excess current condition, a high voltage condition, or any other electronics operating condition where voltage, current, power, or some other electrical parameter is outside an expected range or threshold.

The disclosed techniques can be used in a wide variety of applications including, for example, space-based systems, communication systems, radars, medical equipment, traffic control, and electronic warfare systems. In accordance with an embodiment, an overvoltage detection circuit to implement these techniques includes a fuse configured to provide a non-volatile indication of an actual overvoltage event. In particular, an actual overvoltage event causes the fuse to transition to an open state. In more detail, the overvoltage detection circuit also includes a voltage controlled current switch coupled in series to the fuse. The voltage controlled current switch is configured to enable current flow through the fuse in response to a supply voltage actually exceeding a threshold value associated with the overvoltage event. That current, when allowed to flow, causes the fuse to switch from a closed state to an open state (e.g., the fuse blows), providing a non-volatile record of the overvoltage event. This non-volatile record allows for a relatively unambiguous determination that the event was real. In ground-based applications, that determination can be made, for example, through physical inspection of the fuse. In space-based applications, or whenever physical inspection of the fuse is not practical or convenient, the determination can be made through voltage measurement of a monitoring port of the overvoltage detector circuit, which effectively provides sensor access to a node associated with the fuse, as will be explained in greater detail below. In some embodiments, the voltage controlled current switch can be implemented, for instance, with a Zener diode with a breakdown voltage based on the threshold value, or a transistor configured to switch into conducting mode at the threshold value. In some embodiments, the electronics protected by the circuit can continue to operate normally when the fuse is in the open state.

It will be appreciated that the techniques described herein may provide an improved method for non-volatile overvoltage detection, compared to traditional monitoring that is performed with test equipment, because a test measurement of an overvoltage condition cannot distinguish between an actual overvoltage and an erroneous measurement. Additionally, the state information generated by existing systems can be volatile and therefore lost when power is removed to place the hardware in a safe condition. Numerous embodiments and applications will be apparent in light of this disclosure.

Circuit Architecture

Figure 1:
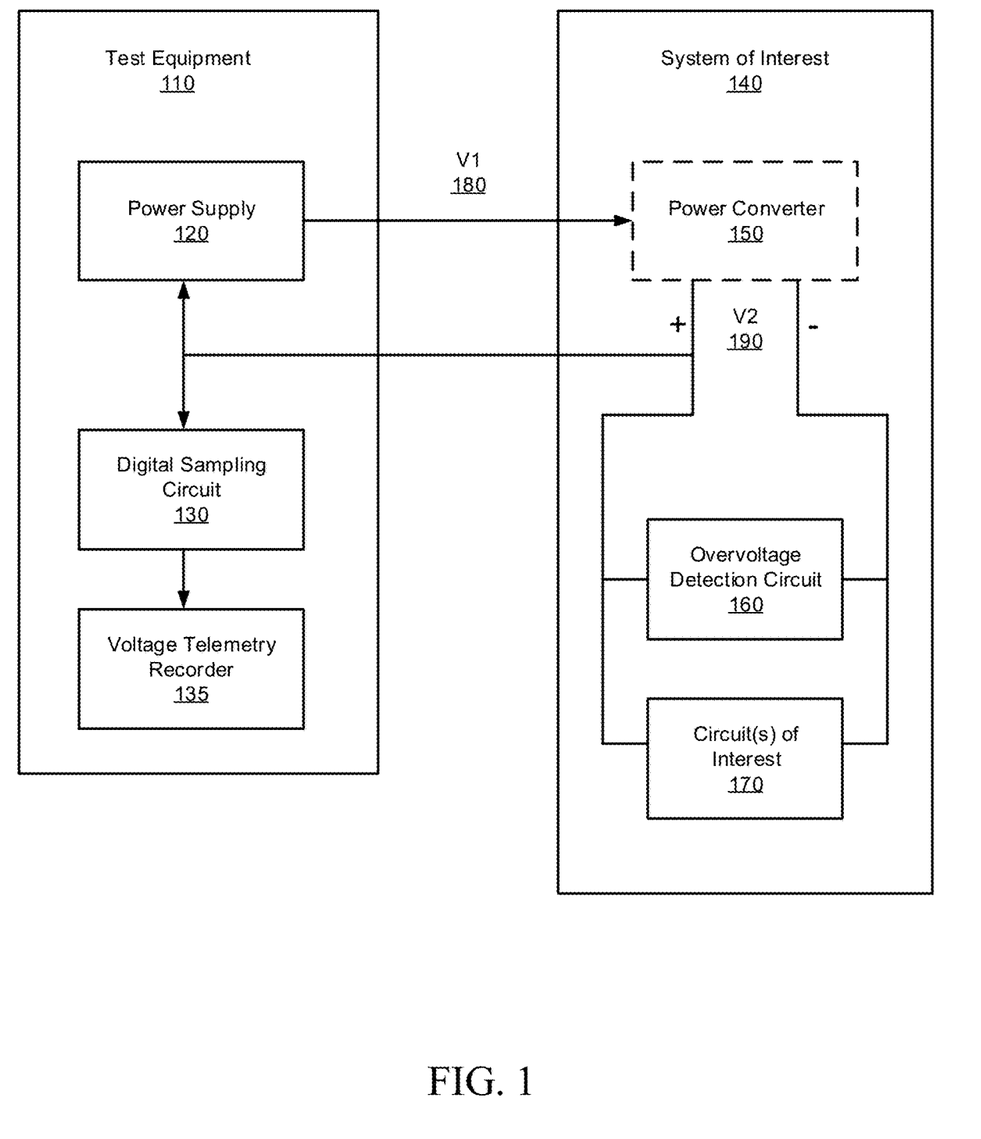
FIG. 1 illustrates a ground-based deployment of an overvoltage detection circuit, in accordance with certain embodiments of the present disclosure.

FIG. 1 illustrates a ground-based deployment 100 of an overvoltage detection circuit, in accordance with certain embodiments of the present disclosure. The ground-based deployment employs test (or monitoring) equipment 110, configured to monitor a system of interest 140. The test equipment 110 is shown to include a power supply 120, a digital sampling circuit 130, and a voltage telemetry recorder 135. The system of interest 140 is shown to include a power converter (or regulator) 150, an overvoltage detection circuit 160, and one or more circuits of interest 170.

Power supply 120 is configured to provide power to the system of interest 140 at a voltage V1 180 that is suitable for powering components of the system of interest 140. In some embodiments, voltage V1 may be on the order of 28 volts. Power converter (or regulator) 150 is configured to transform voltage V1 180 into a second voltage V2 190 that is suitable for powering the circuit(s) of interest 170. In some embodiments, voltage V2 190 may be on the order of 5 volts. Power supply 120 is also configured to monitor voltage V2 190 to detect an overvoltage condition, which may be a transient condition, and shutdown the system of interest 140 by removing power (e.g., voltage V1 180). An overvoltage condition may be defined as a voltage that exceeds a selected threshold voltage value for a selected period of time.

In some embodiments, power supply 120 may be configured to provide power at voltage V1 180 that is suitable for powering all circuits of interest of the system 140, and thus, in such embodiments, power converter 150 is not present, and V2 190 will be understood to refer instead to V1 180. Power converter 150 is illustrated with a dashed line to indicate that this component is optional in some embodiments.

Digital sampling circuit 130 is configured to sample the monitored voltage V2 190 at a selected sampling rate, and voltage telemetry recorder 135 is configured to record or otherwise store those samples for subsequent analysis. Thus, if an overvoltage event occurs, the system of interest may be protected to some extent by removing power, and the event is recorded. As previously stated, however, analysis of the record may not be conclusive to determine if the overvoltage event was real or an error or artifact of the measuring process. To this end, overvoltage detection circuit 160 provides a more reliable and non-volatile record of the overvoltage event, as will be described in greater detail below. This non-volatile record persists after power is removed from the system, as is typically the case when an overvoltage event is detected.

Figure 2:
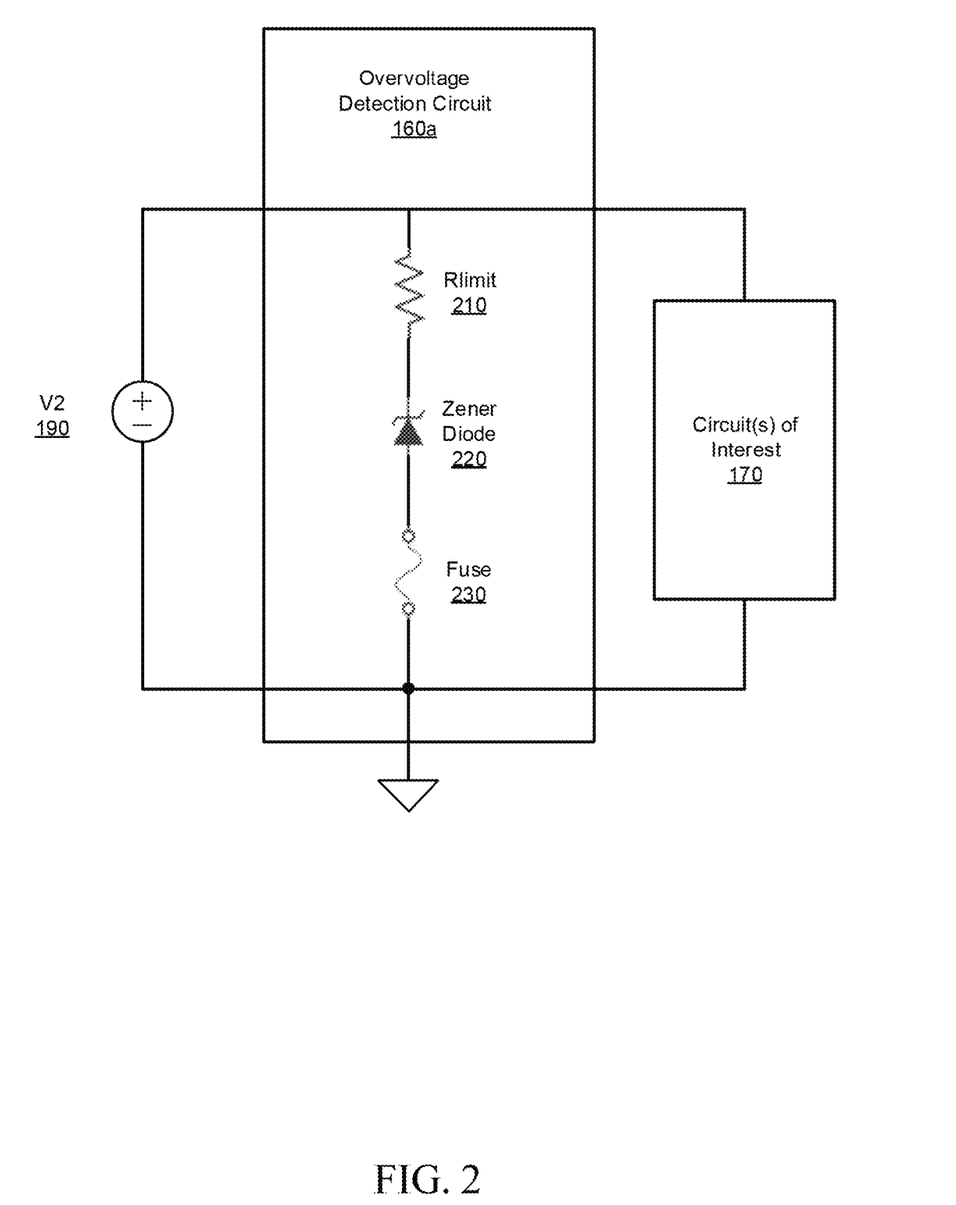
FIG. 2 illustrates an overvoltage detection circuit, configured in accordance with certain embodiments of the present disclosure.

FIG. 2 illustrates an overvoltage detection circuit 160a, configured in accordance with certain embodiments of the present disclosure. The overvoltage detection circuit 160a is configured to provide a non-volatile record of an overvoltage event and is shown to include a current limiting resistor Rlimit 210, a Zener diode 220, and a fuse 230. The resistor 210, Zener diode 220, and fuse 230 are coupled in series in a branch circuit, which in turn is coupled in parallel to the power converter 150 (or, in some embodiments, directly to power supply 120) and the circuits of interest 170. The order of the coupling of components 210, 220, and 230 may be varied from the order shown in FIG. 2, as will be described below, for example, in connection with FIG. 5.

Zener diode 220 is selected to provide a breakdown voltage that is substantially similar to the threshold voltage associated with an overvoltage event. In some embodiments, two or more Zener diodes may be coupled in series to achieve a desired breakdown voltage. While the supply voltage V2 190 remains below the breakdown voltage, for example during normal operation, the Zener diode 220 does not conduct current and fuse 230 remains in a closed (e.g., intact) state. In the event of an overvoltage condition, in which V2 190 exceeds the Zener diode breakdown voltage, the Zener diode begins to conduct current in a manner similar to that of a short circuit, and that current flows through the fuse 230. The current rating of the fuse 230 is selected based on the application, but is generally chosen so that the fuse switches to an open state (e.g., the fuse blows), when the Zener diode allows current to flow. In some embodiments, a circuit breaker or other similar device may be used as an alternative, or in conjunction with the fuse. In some embodiments, current limiting resistor 210 may be provided as an optional component to limit the flow of current through the overvoltage detection circuit 160a before the fuse 230 blows to prevent or limit damage to the power converter 150 or power supply 120.

The opening or blowing of the fuse 230 provides a non-volatile and relatively accurate record of the overvoltage event. The overvoltage event may thus be verified through subsequent analysis or inspection of the circuit to determine that the fuse has opened. If, however, the overvoltage event was not real (i.e., the event was test equipment based), the fuse 230 would remain intact and lead the investigation into the cause of the problem in other directions.

Figure 3:
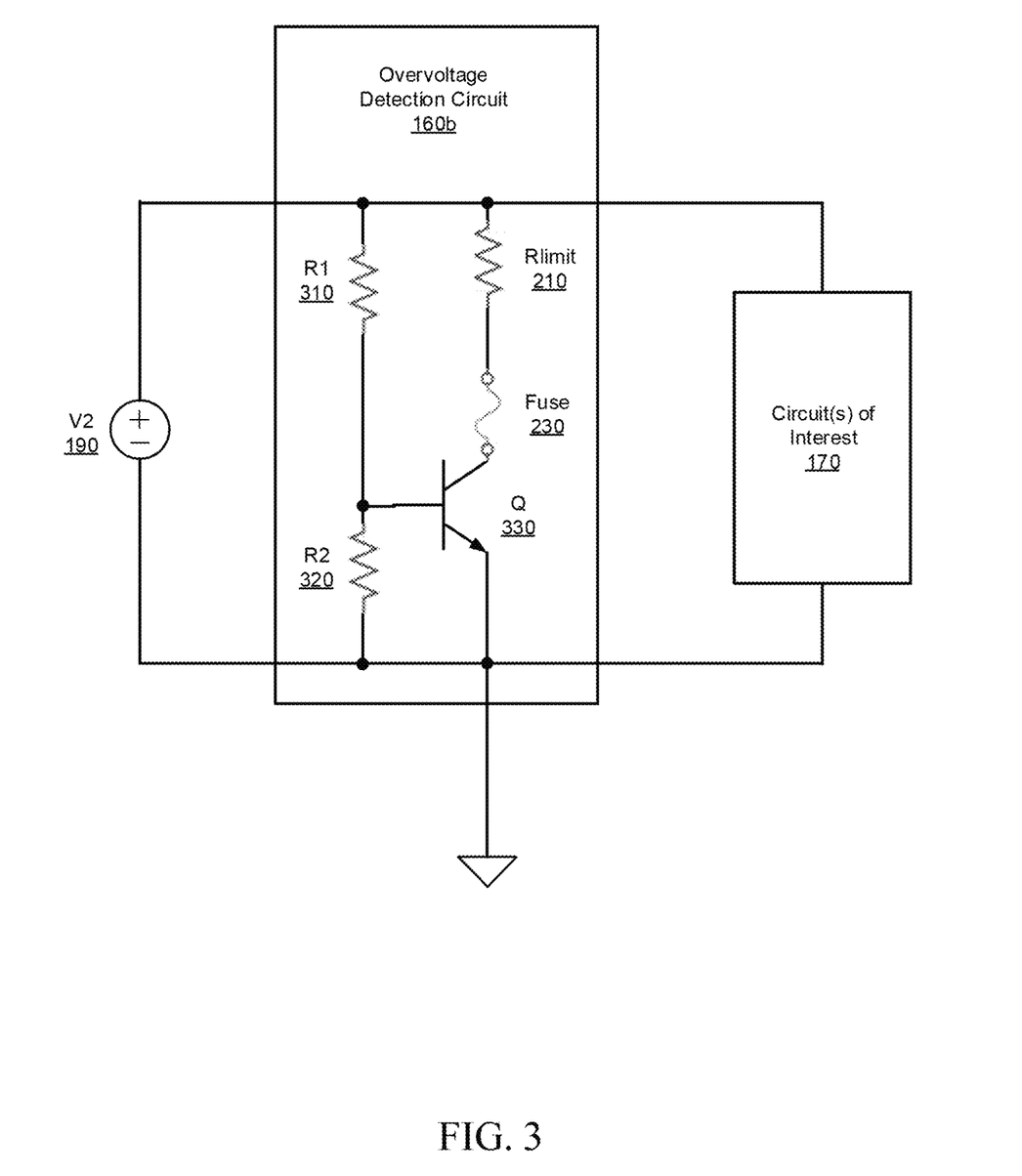
FIG. 3 illustrates another overvoltage detection circuit, configured in accordance with certain other embodiments of the present disclosure.

FIG. 3 illustrates another overvoltage detection circuit 160b, configured in accordance with certain other embodiments of the present disclosure. The overvoltage detection circuit 160b is configured to provide a non-volatile record of an overvoltage event and is shown to include a current limiting resistor Rlimit 210, a fuse 230, a transistor Q 330, and a voltage divider resistor network comprising resistors R1 310 and R2 320. The operation of overvoltage detection circuit 160b is similar to that of circuit 160a described above, but for the fact that a transistor 330 is substituted for the Zener diode 220. The operation of transistor 330 is controlled by a voltage generated by the voltage divider resistor network (R1, R2) and applied to the base of the transistor. The values of resistors R1 310 and R2 320 are selected such that if the supply voltage V2 190 exceeds a threshold associated with an overvoltage event, the voltage applied to the base of the transistor will cause the transistor to switch into a current conducting mode, causing current to flow through the fuse 230. The current rating of the fuse 230 is again selected based on the application, but is generally chosen so that the fuse switches to an open state (e.g., the fuse blows), when the transistor allows current to flow. In some embodiments, current limiting resistor 210 may be provided as an optional component to limit the flow of current through the overvoltage detection circuit 160*b* before the fuse 230 blows to prevent or limit damage to the power converter 150 or power supply 120. The use of the transistor 330 instead of a Zener diode may be advantageous in applications where the breakdown voltage of a Zener diode is not suitable for the application.

As previously described in connection with circuit 160*a*, here again the opening or blowing of the fuse 230 provides a non-volatile and relatively accurate record of the overvoltage event which may be verified through subsequent analysis or inspection of the circuit to determine that the fuse has opened.

Figure 4:
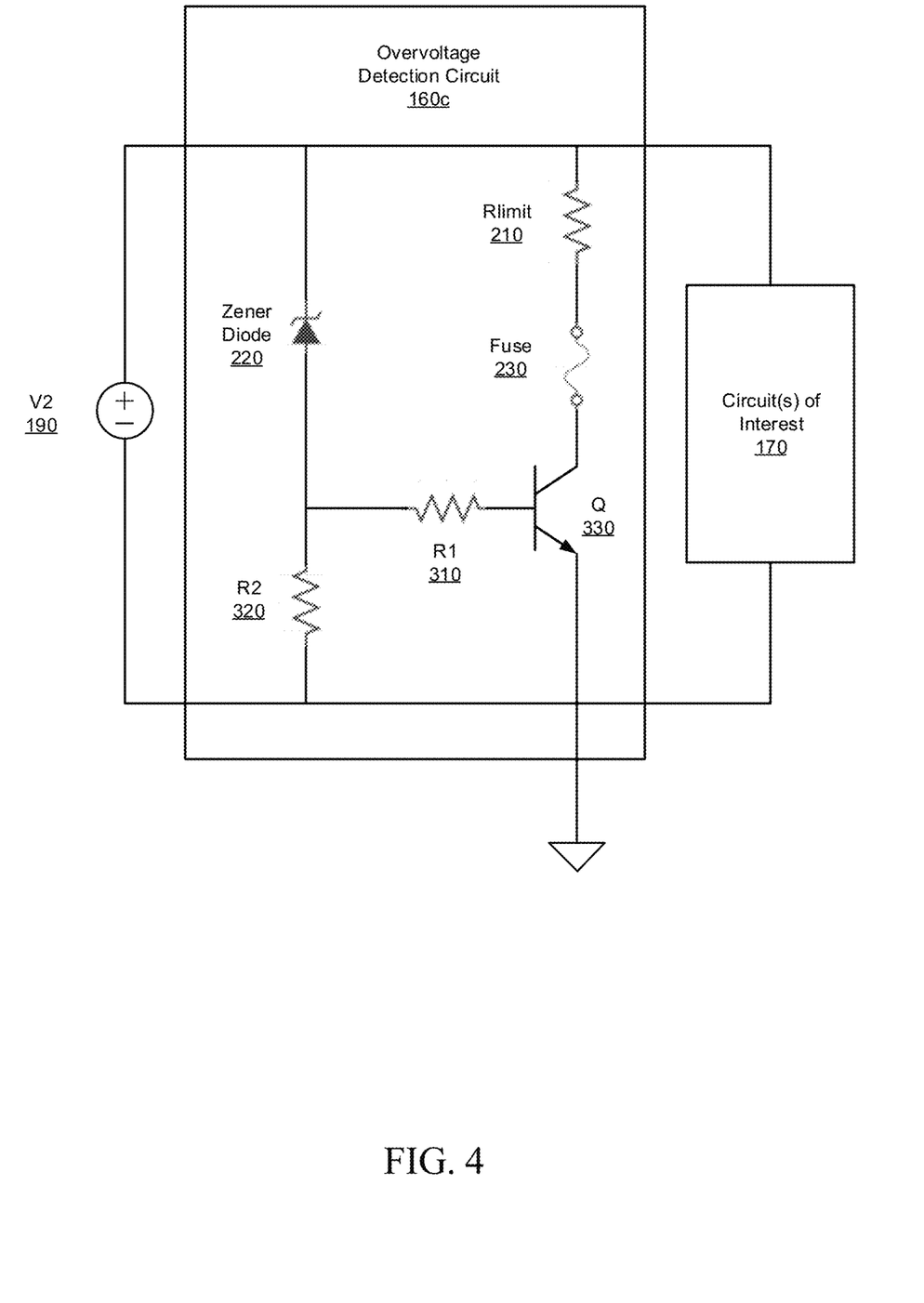
FIG. 4 illustrates another overvoltage detection circuit, configured in accordance with certain other embodiments of the present disclosure.

FIG. 4 illustrates another overvoltage detection circuit 160*c*, configured in accordance with certain other embodiments of the present disclosure. The operation of overvoltage detection circuit 160*c* is similar to that of circuit 160*b* described above, but for the fact that a Zener diode 220 is employed in the control of the operation of transistor 330. In particular, the operation of transistor 330 is controlled by a voltage generated by the Zener diode 220 and the resistor network (R1, R2) and applied to the base of the transistor. The breakdown voltage of the Zener diode 220 and the values of resistors R1 310 and R2 320 are selected such that if the supply voltage V2 190 exceeds a threshold associated with an overvoltage event, the voltage applied to the base of the transistor will cause the transistor to switch into a current conducting mode, causing current to flow through the fuse 230. The fuse will then provide a non-volatile record of the overvoltage event as described above.

Figure 5:
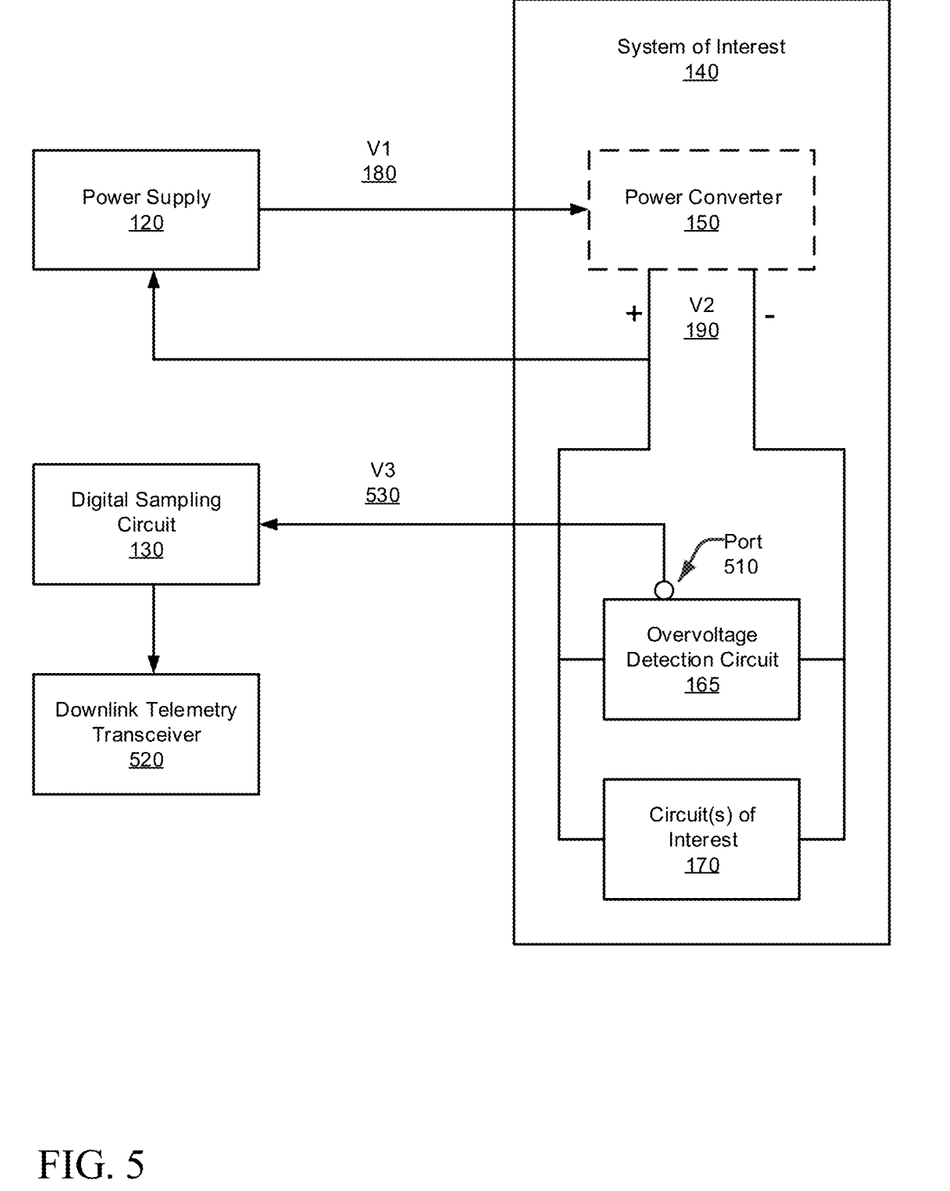
FIG. 5 illustrates a space-based deployment of an overvoltage detection circuit, in accordance with certain embodiments of the present disclosure.

FIG. 5 illustrates a space-based deployment 500 of an overvoltage detection circuit, in accordance with certain embodiments of the present disclosure. The space-based deployment 500 is similar to the ground-based deployment 100, as described previously, but is suitable for applications where physical inspection of the fuse is not possible or practical, such as is the case with space-based applications. The space-based deployment 500 is shown to include a power supply 120, a digital sampling circuit 130, a downlink telemetry transceiver 520, and the system of interest 140. As described previously, the system of interest 140 is shown to include a power converter (or regulator) 150, an overvoltage detection circuit 165, and one or more circuits of interest 170.

Power supply 120 is configured to provide power to the system of interest 140 at a voltage V1 180 that is suitable for powering components of the system of interest 140. In some embodiments, voltage V1 may be on the order of 28 volts. In some embodiments, voltage V2 190 may be on the order of 5 volts. Power supply 120 is also configured to monitor voltage V2 190 to detect an overvoltage condition, which may be a transient condition, and shutdown the system of interest 140 by removing power (e.g., voltage V1 180).

In some embodiments, power supply 120 may be configured to provide power at voltage V1 180 that is suitable for powering all circuits of interest of the system 140, and thus, in such embodiments, power converter 150 is not present, and V2 190 will be understood to refer instead to V1 180.

Power converter 150 is illustrated with a dashed line to indicate that this component is optional in some embodiments.

Digital sampling circuit 130 is configured to sample a voltage V3 530 at a monitoring port 510 of the overvoltage detection circuit 165 at a selected sampling rate. The monitoring port of the overvoltage detection circuit 165 is configured to provide an indication of the state of the fuse and thus provide a non-volatile record of an overvoltage event if such event actually occurs. In some embodiments, the digital sampling circuit 130 may further be configured to store a record of the samples, or any other suitable indication of the state of the fuse, in a nonvolatile memory, along with a timestamp associated with the event or events for subsequent analysis. The monitoring port 510 will be described in greater detail below in connection with FIG. 5.

Downlink telemetry transceiver 520 is configured to record or transmit the monitoring port samples to an earth-based receiving station or other facility interested in the state of the system of interest 140.

Figure 6:
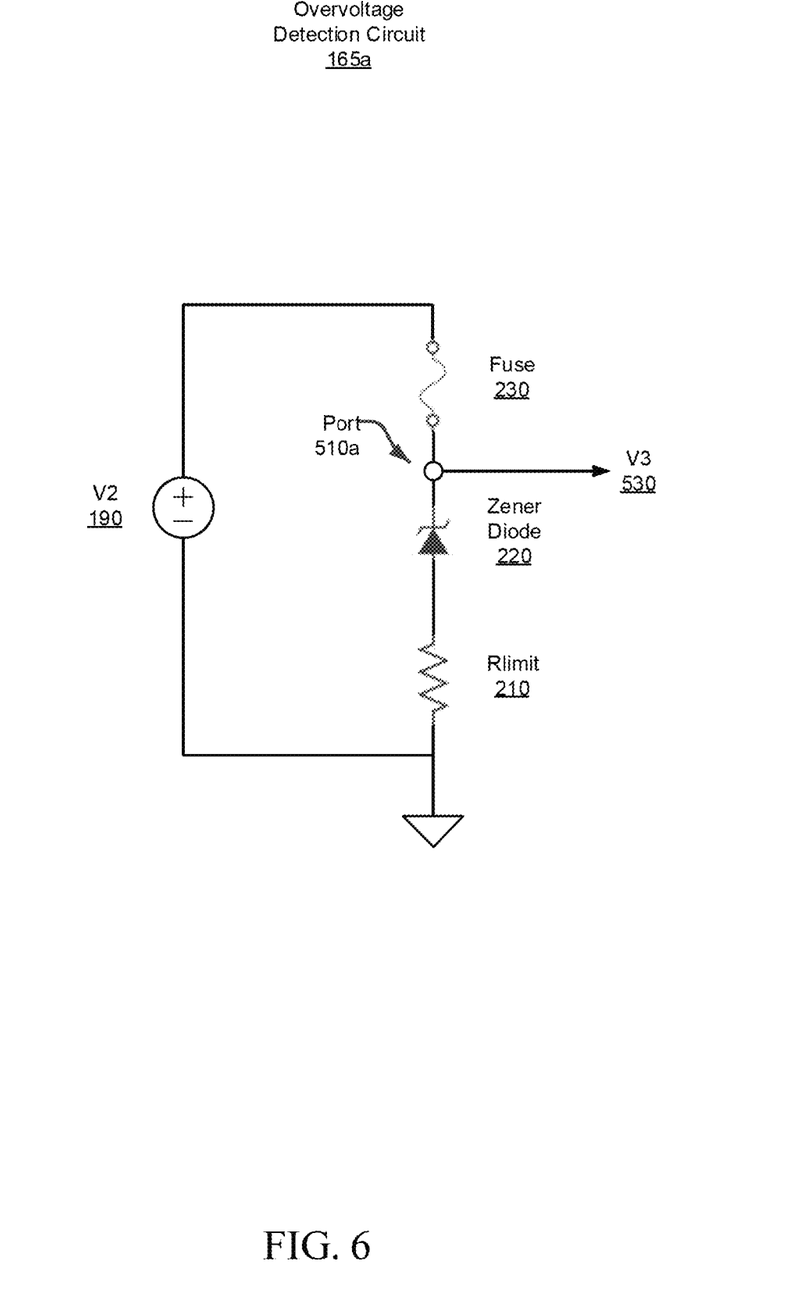
FIG. 6 illustrates another overvoltage detection circuit, configured in accordance with certain other embodiments of the present disclosure.

FIG. 6 illustrate another overvoltage detection circuit 165*a*, configured in accordance with certain other embodiments of the present disclosure. Overvoltage detection circuit 165*a* is similar to, and operates in the same manner, as overvoltage detection circuit 160*a*, described previously, with the exception that the components (fuse 230, Zener diode 220, and current limiting resistor 210) are arranged in reverse order, and monitoring port 510*a* is provided between the fuse 230 and the Zener diode 220. The components are reversed so that monitoring port 510*a* provides access to a voltage V3 530 which will be equal to, or substantially similar to, voltage V2 190, while the fuse is in the closed state (e.g., intact), but will be in a floating state if the fuse is open (e.g., blown). Thus, monitoring port 510*a* provides a real-time indication of the state of the fuse 230 in circuit 165*a*, and thus the non-volatile record of an overvoltage event.

Figure 7:
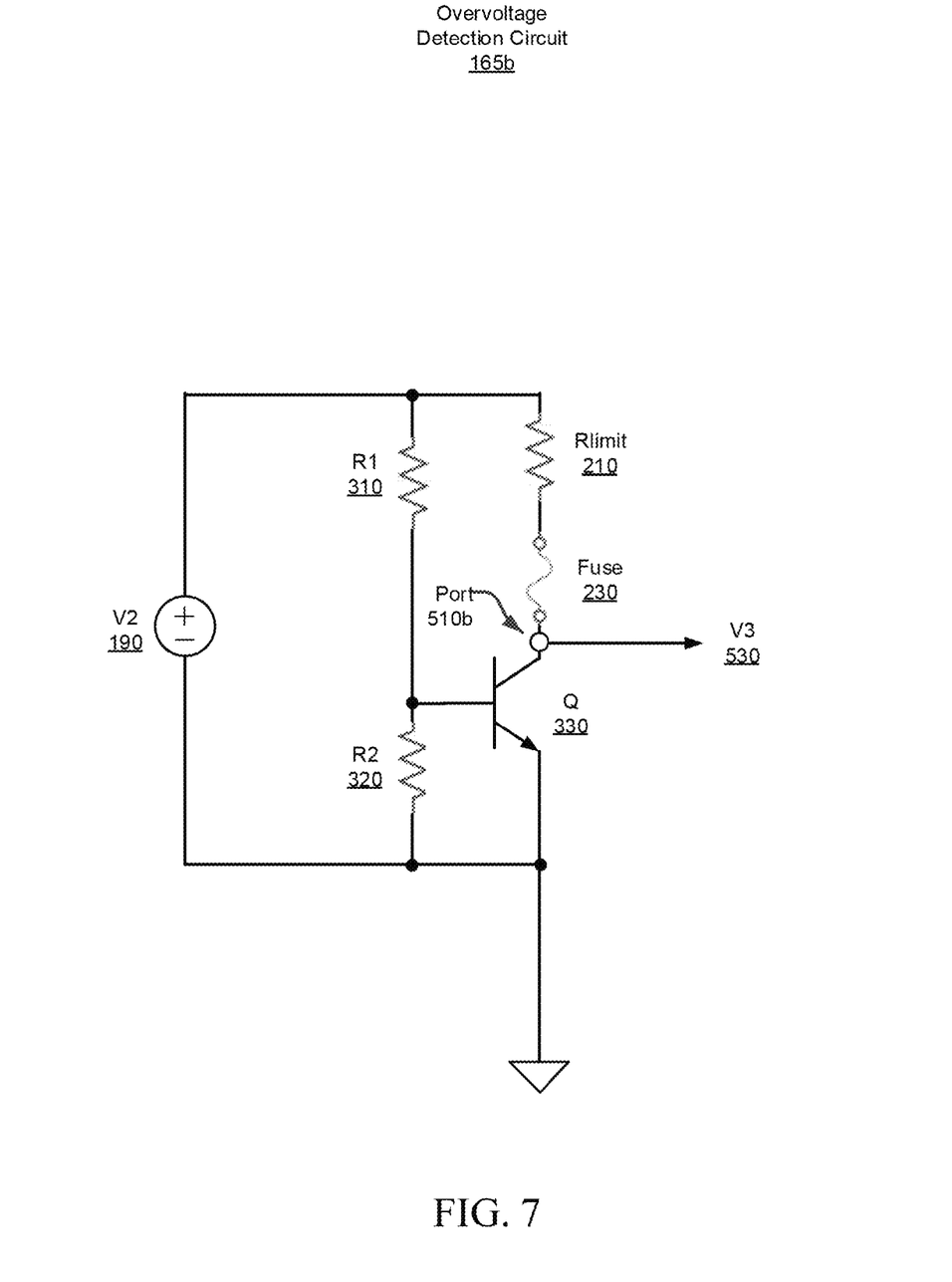
FIG. 7 illustrates another overvoltage detection circuit, configured in accordance with certain other embodiments of the present disclosure.

FIG. 7 illustrate another overvoltage detection circuit 165*b*, configured in accordance with certain other embodiments of the present disclosure. Overvoltage detection circuit 165*b* is similar to, and operates in the same manner, as overvoltage detection circuit 160*b*, described previously, with the exception that monitoring port 510*b* is provided between the fuse 230 and the transistor 330. Monitoring port 510*b* provides access to a voltage V3 530 which will be substantially similar to voltage V2 190 (minus any small voltage drop across resistor 210), while the fuse is in the closed state (e.g., intact), but will be in a floating state if the fuse is open (e.g., blown). Thus, monitoring port 510*b* provides a real-time indication of the state of the fuse 230 in circuit 165*b*, and thus the non-volatile record of an overvoltage event.

Figure 8:
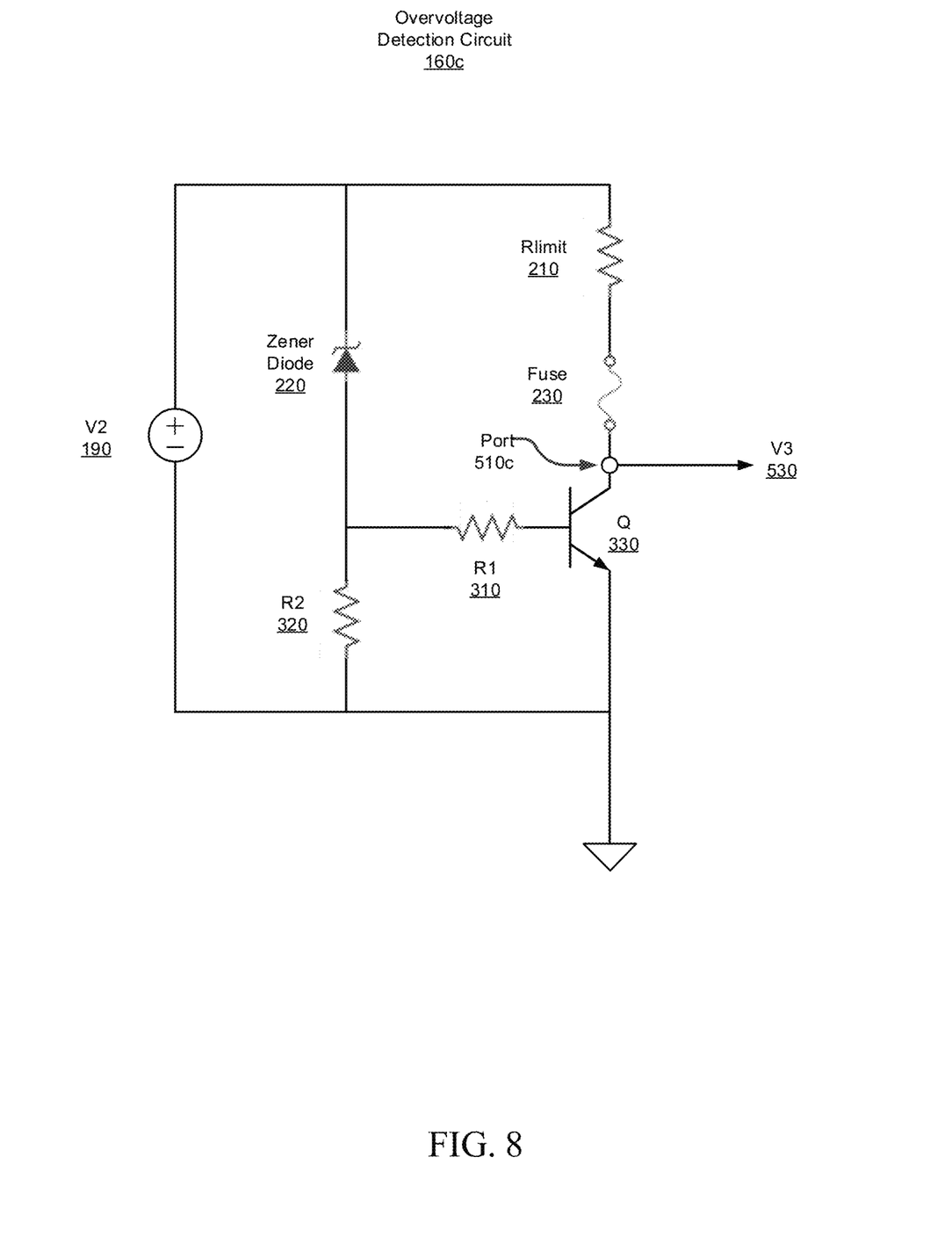
FIG. 8 illustrates another overvoltage detection circuit, configured in accordance with certain other embodiments of the present disclosure.

FIG. 8 illustrate another overvoltage detection circuit 165*c*, configured in accordance with certain other embodiments of the present disclosure. Overvoltage detection circuit 165*c* is similar to, and operates in the same manner, as overvoltage detection circuit 160*c*, described previously, with the exception that monitoring port 510*c* is provided between the fuse 230 and the transistor 330. Monitoring port 510*c* provides access to a voltage V3 530 which will be substantially similar to voltage V2 190 (minus any small voltage drop across resistor 210), while the fuse is in the closed state (e.g., intact), but will be in a floating state if the fuse is open (e.g., blown). Thus, monitoring port 510*c* provides a real-time indication of the state of the fuse 230 in circuit 165*c*, and thus the non-volatile record of an overvoltage event.

Methodology

Figure 9:
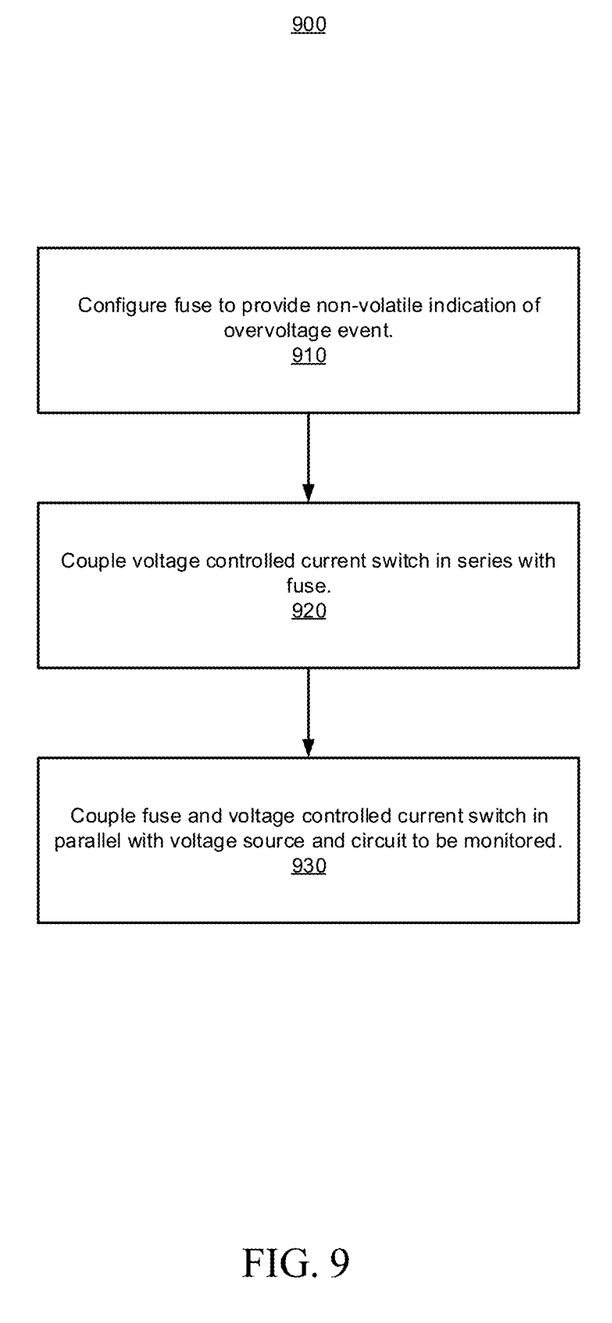
FIG. 9 is a flowchart illustrating a methodology for fabrication of an overvoltage detection circuit, in accordance with an embodiment of the present disclosure.

FIG. 9 is a flowchart illustrating a methodology for fabrication of an overvoltage detection circuit, in accordance with an embodiment of the present disclosure. As can be seen, example method 900 includes a number of phases and sub-processes, the sequence of which may vary from one embodiment to another. However, when considered in aggregate, these phases and sub-processes form a fabrication process for an overvoltage detection circuit, in accordance with certain of the embodiments disclosed herein. These embodiments can be implemented, for example using the system architecture illustrated in FIGS. 1-8, as described above. However other system architectures can be used in other embodiments, as will be apparent in light of this disclosure. To this end, the correlation of the various functions shown in FIG. 9 to the specific components illustrated in FIGS. 1-8 is not intended to imply any structural and/or use limitations. Rather other embodiments may include, for example, varying degrees of integration wherein multiple functionalities are effectively performed by one system. Numerous variations and alternative configurations will be apparent in light of this disclosure.

As illustrated in FIG. 9, in one embodiment method 900 commences, at operation 910, by configuring a fuse to provide a non-volatile indication of an actual but non-persistent overvoltage event. The indication is associated with an open state of the fuse. In some embodiments, the electronics protected by the circuit can continue to operate normally when the fuse is in the open state.

Next, at operation 920, a voltage controlled current switch is coupled in series to the fuse. The voltage controlled current switch is configured to enable current to flow through the fuse in response to a supply voltage exceeding a threshold value. The threshold value is associated with the overvoltage event and the current causes the fuse to switch from a closed state to the open state, thereby recording an occurrence of the actual but non-persistent overvoltage event and distinguishing that event from an erroneous measurement.

At operation 930, the overvoltage monitor circuit is coupled in parallel to a voltage source (e.g., a voltage regulator) that provides the supply voltage and to the circuit (or circuits) of interest to be monitored for the overvoltage event.

Of course, in some embodiments, additional operations may be performed, as previously described in connection with the system. These additional operations may include, for example, employing a Zener diode or a transistor as the voltage controlled current switch. In some embodiments, the Zener diode is configured with a breakdown voltage based on the threshold value. In some embodiments, the transistor is configured to switch into a current conducting mode based on a control voltage that is proportional to the supply voltage. In some embodiments, a current limiting resistor may be coupled in series with the fuse to provide protection for the voltage source in the event of an overvoltage condition. In some embodiments, a monitoring port may be coupled to the junction of the fuse and the voltage controlled current switch, from which a voltage may be measured to determine whether the fuse is in an open state, or a closed state.

It will be appreciated that in some embodiments, some of the various components may be combined or integrated in a system-on-a-chip (SoC) architecture. In some embodiments, the components may be hardware components, firmware components, software components or any suitable combination of hardware, firmware or software.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). In some embodiments, the hardware may be modeled or developed using hardware description languages such as, for example Verilog or VHDL. Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Unless specifically stated otherwise, it may be appreciated that terms such as "processing," "computing," "calculating," "estimating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, or one or more embedded routines configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads or parallel processes in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), computers, and other processor-based or functional systems. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

One example embodiment of the present disclosure provides an overvoltage monitor circuit comprising: a fuse configured to provide a non-volatile indication of an actual but non-persistent overvoltage event, the indication associated with an open state of the fuse, wherein electronics protected by the circuit can operate normally when the fuse is in the open state; and a voltage controlled current switch coupled in series to the fuse, the voltage controlled current switch configured to enable current to flow through the fuse in response to a supply voltage exceeding a threshold value, the threshold value associated with the overvoltage event, the current causing the fuse to switch from a closed state to the open state, thereby recording an occurrence of the actual but non-persistent overvoltage event and distinguishing that event from an erroneous measurement.

In some cases, the supply voltage is provided by a voltage regulator and the overvoltage monitor circuit is coupled in parallel to the voltage regulator. In some cases, the voltage controlled current switch comprises a Zener diode, the Zener diode configured with a breakdown voltage based on the threshold value. In some cases, the voltage controlled current switch comprises a transistor. In some such cases, the overvoltage monitor circuit further comprises a voltage divider resistor network configured to provide a control voltage that is proportional to the supply voltage, wherein the transistor is switched into a current conducting mode based on the control voltage. In some such cases, the overvoltage monitor circuit further comprises a resistor network and a Zener diode, the Zener diode configured with a breakdown voltage based on the threshold value, the resistor network and the Zener diode configured to provide a control voltage that is proportional to the supply voltage, wherein the transistor is switched into a current conducting mode based on the control voltage. In some cases, the overvoltage monitor circuit further comprises a monitoring port coupled to a junction of the fuse and the voltage controlled current switch, the monitoring port configured to provide a first voltage associated with the open state of the fuse and a second voltage associated with the closed state of the fuse.

Another example embodiment of the present disclosure provides an electronic system comprising: a voltage regulator to provide a supply voltage to a circuit to be monitored; and an overvoltage monitor circuit coupled in parallel to the voltage regulator and to the circuit to be monitored, wherein the overvoltage monitor circuit includes a fuse configured to provide a non-volatile indication of an actual but non-persistent overvoltage event, the indication associated with an open state of the fuse, wherein electronics protected by the circuit can operate normally when the fuse is in the open state, a voltage controlled current switch coupled in series to the fuse, the voltage controlled current switch configured to enable current to flow through the fuse in response to the supply voltage exceeding a threshold value, the threshold value associated with the overvoltage event, the current causing the fuse to switch from a closed state to the open state, thereby recording an occurrence of the actual but non-persistent overvoltage event and distinguishing that event from an erroneous measurement, and a monitoring port coupled to a junction of the fuse and the voltage controlled current switch, the monitoring port configured to provide a first voltage associated with the open state of the fuse and a second voltage associated with the closed state of the fuse.

In some cases, the voltage controlled current switch comprises a Zener diode, the Zener diode configured with a breakdown voltage based on the threshold value. In some cases, the voltage controlled current switch comprises a transistor. In some such cases, the overvoltage monitor circuit further includes a voltage divider resistor network configured to provide a control voltage that is proportional to the supply voltage, wherein the transistor is switched into a current conducting mode based on the control voltage. In some such cases, the overvoltage monitor circuit further includes a resistor network and a Zener diode, the Zener diode configured with a breakdown voltage based on the threshold value, the resistor network and the Zener diode configured to provide a control voltage that is proportional to the supply voltage, wherein the transistor is switched into a current conducting mode based on the control voltage. In some cases, the overvoltage monitor circuit further includes one or both of: a digital sampling circuit to sample voltage measurements at the monitoring port; and/or a voltage recorder to record the sampled voltage measurements.

Another example embodiment of the present disclosure provides a method for fabricating an overvoltage monitor circuit, the method comprising: configuring a fuse to provide a non-volatile indication of an actual but non-persistent overvoltage event, the indication associated with an open state of the fuse, wherein electronics protected by the circuit can operate normally when the fuse is in the open state; and coupling a voltage controlled current switch in series to the fuse, the voltage controlled current switch configured to enable current to flow through the fuse in response to a supply voltage exceeding a threshold value, the threshold value associated with the overvoltage event, the current causing the fuse to switch from a closed state to the open state, thereby recording an occurrence of the actual but non-persistent overvoltage event and distinguishing that event from an erroneous measurement.

In some cases, the supply voltage is provided by a voltage regulator and the method further comprises coupling the overvoltage monitor circuit in parallel to the voltage regulator. In some cases, the voltage controlled current switch comprises a Zener diode, the Zener diode configured with a breakdown voltage based on the threshold value. In some cases, the voltage controlled current switch comprises a transistor. In some such cases, the method further comprises configuring a voltage divider resistor network to provide a control voltage that is proportional to the supply voltage, wherein the transistor is switched into a current conducting mode based on the control voltage. In some such cases, the method further comprises configuring a Zener diode, with a breakdown voltage based on the threshold value, and a resistor network to provide a control voltage that is proportional to the supply voltage, wherein the transistor is switched into a current conducting mode based on the control voltage. In some cases, the method further comprises coupling a monitoring port to a junction of the fuse and the voltage controlled current switch, the monitoring port configured to provide a first voltage associated with the open state of the fuse and a second voltage associated with the closed state of the fuse.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. An overvoltage monitor circuit comprising:
    a fuse configured to provide a non-volatile indication of an actual but non-persistent overvoltage event, the indication associated with an open state of the fuse, wherein electronics protected by the circuit can operate normally when the fuse is in the open state;
    a voltage controlled current switch coupled in series to the fuse, the voltage controlled current switch configured to enable current to flow through the fuse in response to a supply voltage exceeding a threshold value, the threshold value associated with the overvoltage event, the current causing the fuse to switch from a closed state to the open state, thereby recording an occurrence of the actual but non-persistent overvoltage event and distinguishing that event from an erroneous measurement; and
    a monitoring port coupled to a junction of the fuse and the voltage controlled current switch, the monitoring port configured to provide a first voltage associated with the open state of the fuse and a second voltage associated with the closed state of the fuse.

2. The overvoltage monitor circuit of claim 1, wherein the supply voltage is provided by a voltage regulator and the overvoltage monitor circuit is coupled in parallel to the voltage regulator.

3. The overvoltage monitor circuit of claim 1, wherein the voltage controlled current switch comprises a Zener diode, the Zener diode configured with a breakdown voltage based on the threshold value.

4. The overvoltage monitor circuit of claim 1, wherein the voltage controlled current switch comprises a transistor.

5. The overvoltage monitor circuit of claim 4, further comprising a voltage divider resistor network configured to provide a control voltage that is proportional to the supply voltage, wherein the transistor is switched into a current conducting mode based on the control voltage.

6. The overvoltage monitor circuit of claim 4, further comprising a resistor network and a Zener diode, the Zener diode configured with a breakdown voltage based on the threshold value, the resistor network and the Zener diode configured to provide a control voltage that is proportional to the supply voltage, wherein the transistor is switched into a current conducting mode based on the control voltage.

7. An electronic system comprising:
    a voltage regulator to provide a supply voltage to a circuit to be monitored; and
    an overvoltage monitor circuit coupled in parallel to the voltage regulator and to the circuit to be monitored, wherein the overvoltage monitor circuit includes
        a fuse configured to provide a non-volatile indication of an actual but non-persistent overvoltage event, the indication associated with an open state of the fuse, wherein electronics protected by the circuit can operate normally when the fuse is in the open state,
        a voltage controlled current switch coupled in series to the fuse, the voltage controlled current switch configured to enable current to flow through the fuse in response to the supply voltage exceeding a threshold value, the threshold value associated with the overvoltage event, the current causing the fuse to switch from a closed state to the open state, thereby recording an occurrence of the actual but non-persistent overvoltage event and distinguishing that event from an erroneous measurement, and a monitoring port coupled to a junction of the fuse and the voltage controlled current switch, the monitoring port configured to provide a first voltage associated with the open state of the fuse and a second voltage associated with the closed state of the fuse.

8. The system of claim 7, wherein the voltage controlled current switch comprises a Zener diode, the Zener diode configured with a breakdown voltage based on the threshold value.

9. The system of claim 7, wherein the voltage controlled current switch comprises a transistor.

10. The system of claim 9, wherein the overvoltage monitor circuit further includes a voltage divider resistor network configured to provide a control voltage that is proportional to the supply voltage, wherein the transistor is switched into a current conducting mode based on the control voltage.

11. The system of claim 9, wherein the overvoltage monitor circuit further includes a resistor network and a Zener diode, the Zener diode configured with a breakdown voltage based on the threshold value, the resistor network and the Zener diode configured to provide a control voltage that is proportional to the supply voltage, wherein the transistor is switched into a current conducting mode based on the control voltage.

12. The system of claim 7, further comprising one or both of: a digital sampling circuit to sample voltage measurements at the monitoring port; and/or a voltage recorder to record the sampled voltage measurements.

13. A method for fabricating an overvoltage monitor circuit, the method comprising:

configuring a fuse to provide a non-volatile indication of an actual but non-persistent overvoltage event, the indication associated with an open state of the fuse, wherein electronics protected by the circuit can operate normally when the fuse is in the open state;

coupling a voltage controlled current switch in series to the fuse, the voltage controlled current switch configured to enable current to flow through the fuse in response to a supply voltage exceeding a threshold value, the threshold value associated with the overvoltage event, the current causing the fuse to switch from a closed state to the open state, thereby recording an occurrence of the actual but non-persistent overvoltage event and distinguishing that event from an erroneous measurement; and coupling a monitoring port to a junction of the fuse and the voltage controlled current switch, the monitoring port configured to provide a first voltage associated with the open state of the fuse and a second voltage associated with the closed state of the fuse.

14. The method of claim 13, wherein the supply voltage is provided by a voltage regulator and the method further comprises coupling the overvoltage monitor circuit in parallel to the voltage regulator.

15. The method of claim 13, wherein the voltage controlled current switch comprises a Zener diode, the Zener diode configured with a breakdown voltage based on the threshold value.

16. The method of claim 13, wherein the voltage controlled current switch comprises a transistor.

17. The method of claim 16, further comprising configuring a voltage divider resistor network to provide a control voltage that is proportional to the supply voltage, wherein the transistor is switched into a current conducting mode based on the control voltage.

18. The method of claim 16, further comprising configuring a Zener diode, with a breakdown voltage based on the threshold value, and a resistor network to provide a control voltage that is proportional to the supply voltage, wherein the transistor is switched into a current conducting mode based on the control voltage.

* * * * *